(12) United States Patent
Horikoshi et al.

(10) Patent No.: US 6,740,725 B2
(45) Date of Patent: May 25, 2004

(54) ROOM TEMPERATURE CURABLE ORGANOPOLYSILOXANE COMPOSITIONS

(75) Inventors: Jun Horikoshi, Gunma-ken (JP); Tsuneo Kimura, Gunma-ken (JP); Hironao Fujiki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/183,419

(22) Filed: Jun. 28, 2002

(65) Prior Publication Data

US 2003/0083455 A1 May 1, 2003

(30) Foreign Application Priority Data

Jun. 28, 2001 (JP) ........................................ 2001-196122

(51) Int. Cl.⁷ ............................................... C08G 77/26
(52) U.S. Cl. ........................... 528/21; 525/477; 528/34; 528/901
(58) Field of Search ............................ 528/21, 34, 901; 525/477

(56) References Cited

U.S. PATENT DOCUMENTS

| | | | | |
|---|---|---|---|---|
| 4,180,642 A | * | 12/1979 | Takago |
| 4,248,992 A | | 2/1981 | Takago |
| 4,339,563 A | * | 7/1982 | Takago et al. |
| 4,695,617 A | | 9/1987 | Inoue et al. |
| 4,734,479 A | * | 3/1988 | Inoue et al. |
| 4,965,333 A | | 10/1990 | Inouye et al. |
| 5,049,635 A | | 9/1991 | Inoue |

* cited by examiner

*Primary Examiner*—Kuo-Liang Peng
(74) *Attorney, Agent, or Firm*—Birch, Stewart, Kolasch & Birch, LLP

(57) ABSTRACT

A room temperature curable organopolysiloxane composition comprising (a) an organopolysiloxane having a specific structure, (b) a alkenoxysilane or substituted alkenoxysilane or a partial hydrolyzate thereof, and (c) a siloxane or a partial hydrolyzate thereof cures into a product which experiences no decline of insulation resistance upon application of voltage in a hot humid environment and is resistant to electrolytic corrosion.

9 Claims, No Drawings

ROOM TEMPERATURE CURABLE ORGANOPOLYSILOXANE COMPOSITIONS

This invention relates to one-part room temperature curable organopolysiloxane compositions having improved electrical properties, especially resistance to electrolytic corrosion.

BACKGROUND OF THE INVENTION

In the prior art, one-part room temperature curable organopolysiloxane compositions are applied to circuit boards for electric and electronic applications and used as the moisture-proof and anti-fouling coat. A problem arises that the cured organopolysiloxane compositions experience a decline of insulation resistance upon application of voltage in a hot humid environment.

SUMMARY OF THE INVENTION

An object of the present invention is to provide a one-part room temperature curable organopolysiloxane composition which has eliminated the drawbacks of the prior art compositions, and cures into a product which is resistant to electrolytic corrosion in that no decline of insulation resistance occurs upon application of voltage in a hot humid environment.

It has been found that a room temperature curable organopolysiloxane composition comprising (a) an organopolysiloxane having a specific structure, (b) a alkenoxysilane or substituted alkenoxysilane or a partial hydrolyzate thereof, and (c) a siloxane or a partial hydrolyzate thereof cures into a product which does experience no decline of insulation resistance upon application of voltage in a hot humid environment and is resistant to electrolytic corrosion.

Accordingly, the present invention provides a room temperature curable organopolysiloxane composition comprising (a) 100 parts by weight of an organopolysiloxane having the following general formula (I):

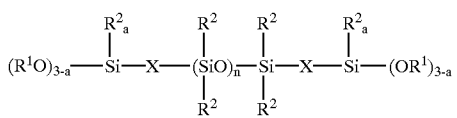

wherein $R^1$ is hydrogen, a substituted or unsubstituted alkyl radical or a substituted or unsubstituted alkenyl radical, $R^2$ is independently a substituted or unsubstituted monovalent hydrocarbon radical, X is an oxygen atom or a divalent hydrocarbon radical, a is 0, 1 or 2, and n is an integer of at least 10, (b) 1 to 30 parts by weight of a substituted or unsubstituted alkenoxysilane having the following general formula (II):

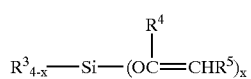

wherein $R^3$ is a substituted or unsubstituted monovalent hydrocarbon radical, $R^4$ and $R^5$ are each independently hydrogen or a substituted or unsubstituted monovalent hydrocarbon radical, and x is 3 or 4, or a partial hydrolyzate thereof, and (c) 0.01 to 10 parts by weight of a siloxane containing per molecule at least one monovalent radical having the general formula (III):

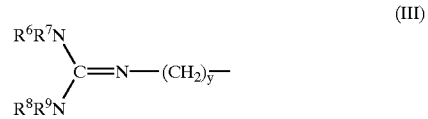

wherein $R^6$, $R^7$, $R^8$ and $R^9$ each are hydrogen or a monovalent hydrocarbon radical, and y is an integer of 1 to 6, at least two silicon atoms, and at least three radicals selected from the group consisting of alkyl, alkoxy and alkenoxy radicals, or a partial hydrolyzate thereof.

DESCRIPTION OF THE PREFERRED EMBODIMENT

Component (a) serving as the base in the composition of the invention is an organopolysiloxane having the following general formula (I).

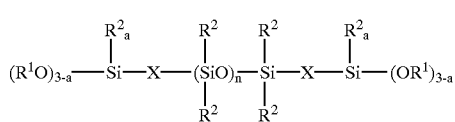

Herein, $R^1$ is hydrogen, a substituted or unsubstituted alkyl radical, preferably having 1 to 10 carbon atoms, more preferably 1 to 8 carbon atoms, or a substituted or unsubstituted alkenyl radical, preferably having 2 to 10 carbon atoms, more preferably 2 to 8 carbon atoms. $R^2$ which may be the same or different is a substituted or unsubstituted monovalent hydrocarbon radical, preferably having 1 to 10 carbon atoms. X is an oxygen atom or a divalent hydrocarbon radical, preferably having 1 to 10 carbon atoms. The letter "a" is 0, 1 or 2, and n is an integer of at least 10.

More particularly, of the radicals represented by $R^1$, suitable alkyl radicals include, but are not limited to, methyl, ethyl, propyl, and butyl, and substituted ones of these alkyl radicals in which some or all of the hydrogen atoms are substituted with halogen atoms, cyano or the like, for example, halogenated alkyl radicals such as chloromethyl, trichloropropyl and trifluoropropyl and cyanoalkyl radicals such as 2-cyanoethyl, 3-cyanopropyl and 2-cyanobutyl. Of these, methyl and ethyl are preferred. Suitable alkenyl radicals include alkenyl radicals such as vinyl, allyl and isopropenyl, and substituted ones of these alkenyl radicals in which some or all of the hydrogen atoms are substituted with aryl radicals (e.g., phenyl), such as phenylethenyl. Of these, isopropenyl and vinyl are preferred. It is preferred that "a" be 2 where $R^1$ is hydrogen, and "a" be 0 or 1 where $R^1$ is an alkyl or alkenyl radical.

The hydrocarbon radicals represented by $R^2$ include, but are not limited to, alkyl radicals such as methyl, ethyl, propyl, isopropyl, butyl, 2-ethylbutyl and octyl; cycloalkyl radicals such as cyclohexyl and cyclopentyl; alkenyl radicals such as vinyl and allyl; aryl radicals such as phenyl, tolyl, xylyl, naphthyl, biphenyl and phenanthryl; aralkyl radicals such as benzyl and phenylethyl; and substituted ones of the foregoing radicals in which some or all of the hydrogen atoms are substituted with halogen atoms, cyano or the like, for example, halogenated hydrocarbon radicals such as chloromethyl, trichloropropyl, trifluoropropyl, bromophenyl and chlorocyclohexyl, and cyano hydrocarbon radicals such as 2-cyanoethyl, 3-cyanopropyl and 2-cyanobutyl. Of these, methyl is preferred.

X is an oxygen atom or an alkylene radical such as methylene, ethylene and propylene, with the oxygen and ethylene being preferred.

Preferably, the organopolysiloxane is capped with a hydroxyl radical at either end of its molecular chain, especially with one hydroxyl radical at each end of its molecular chain.

In formula (1), n is an integer of 10 or greater. The organopolysiloxane preferably has a viscosity of about 25 to 1,000,000 centistokes (cSt) at 25° C., and more preferably about 500 to 500,000 cSt at 25° C.

Component (b) serving as a curing agent in the inventive composition is an alkenoxysilane or substituted alkenoxysilane having the following general formula (II) or a partial hydrolyzate thereof.

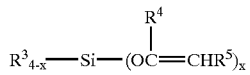
(II)

Herein, $R^3$ is a substituted or unsubstituted monovalent hydrocarbon radical, preferably having 1 to 10 carbon atoms. $R^4$ and $R^5$ which may be the same or different are hydrogen or substituted or unsubstituted monovalent hydrocarbon radicals, preferably having 1 to 10 carbon atoms. The letter x is 3 or 4.

More particularly, suitable hydrocarbon radicals represented by $R^3$ include alkyl, alkenyl, aryl and other radicals as exemplified above for $R^2$. The monovalent hydrocarbon radicals represented by $R^4$ and $R^5$ include alkyl, alkenyl and other radicals as exemplified above for $R^2$.

Illustrative, non-limiting examples of the alkenoxysilane (b) include methyltrivinyloxysilane, methyltri (isopropenyloxy)silane, vinyltri(isopropenyloxy)silane, phenyltri(isopropenyloxy)silane, propyltri(isopropenyloxy) silane, tetra(isopropenyloxy)silane, methyltri(1-phenylethenyloxy)silane, methyltri(1-butenyloxy)silane, methyltri (1-methyl-1-propenyloxy)silane, methyltri(1,4-dimethyl-1,3-pentadienyloxy)silane and partial hydrolyzates thereof.

Usually, the alkenoxysilane (b) is added in an amount of 1 to 30 parts, preferably 3 to 20 parts, and more preferably 3 to 10 parts by weight per 100 parts by weight of the organopolysiloxane (a). Less than 1 part of component (b) effects insufficient crosslinking, failing to provide the desired rubbery elasticity in the cured state. More than 30 parts of component (b) entails an increased shrinkage factor upon curing, resulting in poor mechanical properties.

Component (c) serving as a curing catalyst in the inventive composition is a siloxane or a partial hydrolyzate thereof. The siloxane should contain per molecule at least one monovalent radical having the general formula (III), at least two silicon atoms, and at least three radicals selected from among alkyl, alkoxy and alkenoxy radicals.

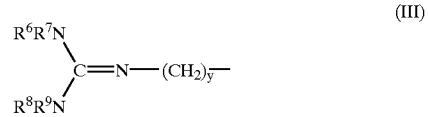
(III)

Herein $R^6$, $R^7$, $R^8$ and $R^9$ each are hydrogen or a monovalent hydrocarbon radical, preferably having 1 to 10 carbon atoms, and y is an integer of 1 to 6. Examples of the monovalent hydrocarbon radicals represented by $R^6$, $R^7$, $R^8$ and $R^9$ include those exemplified above for $R^2$.

Preferably, the siloxane (c) has the following general formula (IV).

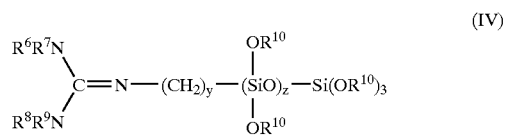
(IV)

Herein $R^6$, $R^7$, $R^8$, $R^9$, and y are as defined in formula (III). $R^{10}$ which may be the same or different is hydrogen, a monovalent hydrocarbon radical, preferably having 1 to 10 carbon atoms, or a radical of the formula:

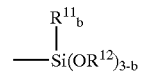

wherein $R^{11}$ is a substituted or unsubstituted monovalent hydrocarbon radical, preferably having. 1 to 10 carbon atoms, $R^{12}$ is a monovalent hydrocarbon radical, preferably having 1 to 10 carbon atoms, and b is 0, 1 or 2. The letter z is an integer of 1 to 5.

Examples of the hydrocarbon radicals represented by $R^{10}$, $R^{11}$ and $R^{12}$ include those exemplified above for $R^2$. $R^{12}$ is preferably selected from alkyl and alkenyl radicals.

Preferred examples of the siloxane (c) are given below.

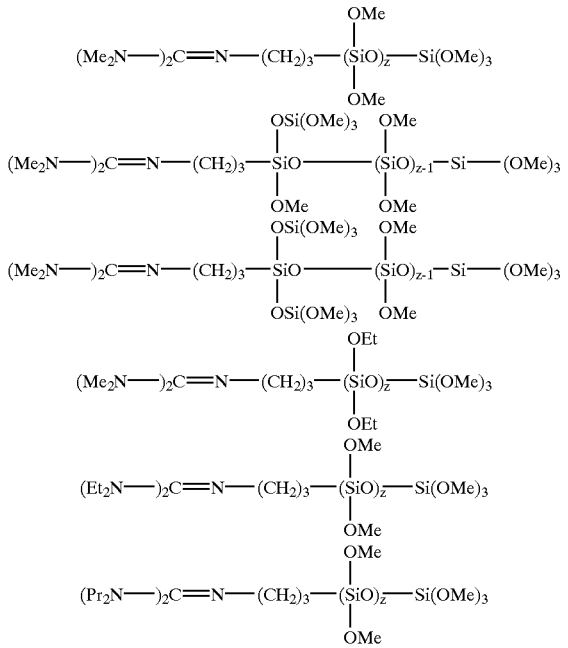

-continued

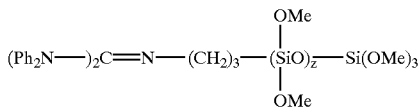

In the formulae, Me is methyl, Et is ethyl, Pr is propyl, Ph is phenyl, and z is an integer of 1 to 5.

Among others, those siloxanes of the formula:

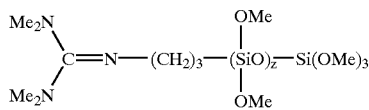

wherein Me is methyl and z is an integer of 1 to 5 are most preferred because of ease of synthesis and rapid film formation (a short tack-free time).

Usually, the siloxane (c) is added in an amount of 0.01 to 10 parts, preferably 0.1 to 5 parts, and more preferably 0.5 to 4 parts by weight per 100 parts by weight of the organopolysiloxane (a). With less than 0.01 part of component (c), a longer time is taken for film formation (a longer tack-free time). More than 10 parts of component (c) extremely quickens film formation or shortens the tack-free time, resulting in difficulty of working.

If necessary, numerous fillers may be blended in the inventive composition. Suitable fillers include finely divided silica, silica aerogel, precipitated silica, diatomaceous earth; metal oxides such as iron oxide, zinc oxide, titanium oxide, and aluminum oxide; metal carbonates such as calcium carbonate, magnesium carbonate and zinc carbonate; asbestos, glass wool, carbon black, fine mica, fused silica powder, and powdered synthetic resins such as polystyrene, polyvinyl chloride, and polypropylene. The fillers may be blended in any desired amount as long as this does not compromise the objects of the invention. It is preferred that the fillers be dried to remove water before use. If desired, the composition may further include pigments, dyes, antidegradants, antioxidants, antistatic agents, flame retardants (e.g., antimony oxide and chlorinated paraffin), and thermal conductivity modifiers (e.g., boron nitride).

Other additives that can be incorporated in the inventive composition include thixotropic agents such as polyether, mildew-proofing agents, antibacterial agents, and adhesive aids, examples of which are aminosilanes such as γ-aminopropyltriethoxysilane and 3-(2-aminoethylamino)propyltrimethoxysilane, and epoxysilanes such as γ-glycidoxypropyltrimethoxysilane and β-(3,4-epoxycyclohexyl)ethyltrimethoxysilane. In particular, the aminosilane is added in an amount of preferably 0.1 to 10 parts, more preferably 0.2 to 5 parts by weight per 100 parts by weight of the organopolysiloxane (a).

If necessary, hydrocarbon solvents such as toluene and petroleum ether, ketones and esters may be added as the diluent.

The inventive composition is obtained by intimately mixing the essential components (a) to (c) and optionally, fillers, various additives, diluents and the like in a dry atmosphere.

The inventive composition remains stable in the sealed state, but when exposed to air, rapidly cures with airborne moisture and firmly adheres to numerous substrates. The composition thus finds effective use in a wide variety of applications as a sealing agent, coating agent, adhesive, coating, water repellent, fiber or fabric treating agent, and parting agent.

EXAMPLE

Examples of the invention are given below by way of illustration and not by way of limitation. All parts are by weight. It is noted that the siloxane prepared in Reference Example was used in Examples and Comparative Examples.

Reference Example

A 1-liter four-necked flask equipped with a thermometer, stirrer, condenser, nitrogen gas inlet and outlet tubes was charged with 278 g (1 mol) of 1,1,3,3-tetramethyl-2-[3-(trimethoxysilyl)propyl]guanidine and 459 g (3 mol) of tetramethoxysilane, which were stirred and mixed at room temperature. With stirring continued, 27 g (1.5 mol) of water was added dropwise. The flask was then heated at 90–100° C., at which the reaction mixture was ripened for 2 hours. Stripping at 120–130° C. and 20 mmHg under nitrogen bubbling yielded 442 g of a product (yield 60%).

This product was a pale yellow liquid having a viscosity η of 16 mPa·s at 23° C., a specific gravity d of 1.06 at 23° C., and a refractive index $n_D$ of 1.435 at 25° C. On $^{29}$Si NMR spectroscopy, there appeared a peak attributable to —(CH$_2$)$_3$—SiO$_{1/2}$(—OMe)$_2$ at –49 ppm, and a peak attributable to —(CH$_2$)$_3$—SiO$_{2/2}$(—OMe) at –58 ppm, but a peak attributable to —(CH$_2$)$_3$—Si(—OMe)$_3$ at –41 ppm was absent. Based on these data, the product was identified to be a siloxane of the following formula wherein Me is methyl and z is an integer of 1 to 5.

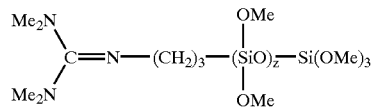

Example 1

A composition was prepared by mixing 100 parts of dimethylpolysiloxane capped with a hydroxyl radical at each end of its molecular chain and having a viscosity of 700 cSt at 25° C. with 8 parts of phenyltri(isopropenyloxy)silane, 1 part of 3-aminopropyltriethoxysilane and 1.5 parts of the siloxane obtained in Reference Example, in a dry state, followed by deaeration and mixing.

Physical properties of the composition were determined, with the results shown below.

| | |
|---|---|
| Tack-free time | 4 min |
| Hardness (Durometer type A) | 27 |
| Elongation at break | 50% |
| Electrolytic corrosion resistance | see Table 1 |

It is noted that the tack-free time, Durometer type A hardness and elongation at break were measured according to JIS K6249. The electrolytic corrosion resistance was determined by applying 1 ml of the composition to JIS-B interdigital electrodes so as to cover the electrode surface, and holding the coating at 23° C., RH 50% for one day for curing. The coated electrode structure was then placed in a thermostat chamber held at 80° C. and RH 90%, where the insulation resistance was measured at predetermined time intervals by applying a DC voltage of 12 volts across the electrodes.

Example 2

A composition was prepared by mixing 100 parts of dimethylpolysiloxane capped with a trimethoxysilyl radical at each end of its molecular chain and having a viscosity of 20,000 cSt at 25° C. with 8 parts of vinyltri(isopropenyloxy)silane, 1 part of 3-aminopropyltriethoxysilane and 1.5 parts of the siloxane obtained in Reference Example, in a dry state, followed by deaeration and mixing.

Physical properties of the composition were determined as in Example 1, with the results shown below.

| | |
|---|---|
| Tack-free time | 8 min |
| Hardness (Durometer type A) | 20 |
| Elongation at break | 300% |
| Electrolytic corrosion resistance | see Table 1 |

Example 3

A composition was prepared by mixing 100 parts of dimethylpolysiloxane capped with a diisopropenoxyvinylsilyl radical at each end of its molecular chain and having a viscosity of 20,000 cSt at 25° C. with 4 parts of vinyltri(isopropenyloxy)silane, 1 part of 3-aminopropyltriethoxysilane and 1.5 parts of the siloxane obtained in Reference Example, in a dry state, followed by deaeration and mixing.

Physical properties of the composition were determined as in Example 1, with the results shown below.

| | |
|---|---|
| Tack-free time | 8 min |
| Hardness (Durometer type A) | 20 |
| Elongation at break | 150% |
| Electrolytic corrosion resistance | see Table 1 |

Example 4

100 parts of dimethylpolysiloxane capped with a hydroxyl radical at each end of its molecular chain and having a viscosity of 5,000 cSt at 25° C. was mixed with 5 parts of fumed silica. The mixture was agitated and mixed in vacuum at 150° C. for 2 hours. Then 60 parts of crystalline silica was added to the mixture, which was agitated and mixed in vacuum at room temperature for 30 minutes. This was further mixed with 8 parts of phenyltri(isopropenyloxy)silane, 1 part of 3-(2-aminoethyl-amino)propyltriethoxysilane and 2 parts of the siloxane obtained in Reference Example, in a dry state, followed by deaeration and mixing.

Physical properties of the resulting composition were determined as in Example 1, with the results shown below.

| | |
|---|---|
| Tack-free time | 5 min |
| Hardness (Durometer type A) | 50 |
| Elongation at break | 200% |
| Electrolytic corrosion resistance | see Table 1 |

Comparative Example 1

A composition was prepared as in Example 1 except that 1 part of 1,1,3,3-tetramethyl-2-[3-(trimethoxysilyl)propyl]guanidine was used instead of 1.5 parts of the siloxane obtained in Reference Example. Physical properties of the composition were similarly determined, with the results shown below.

| | |
|---|---|
| Tack-free time | 4 min |
| Hardness (Durometer type A) | 28 |
| Elongation at break | 50% |
| Electrolytic corrosion resistance | see Table 1 |

Comparative Example 2

A composition was prepared as in Example 2 except that 1 part of 1,1,3,3-tetramethyl-2-[3-(trimethoxysilyl)propyl]guanidine was used instead of 1.5 parts of the siloxane obtained in Reference Example. Physical properties of the composition were similarly determined, with the results shown below.

| | |
|---|---|
| Tack-free time | 8 min |
| Hardness (Durometer type A) | 22 |
| Elongation at break | 280% |
| Electrolytic corrosion resistance | see Table 1 |

Comparative Example 3

A composition was prepared as in Example 3 except that 1 part of 1,1,3,3-tetramethyl-2-[3-(trimethoxysilyl)propyl]guanidine was used instead of 1.5 parts of the siloxane obtained in Reference Example. Physical properties of the composition were similarly determined, with the results shown below.

| | |
|---|---|
| Tack-free time | 9 min |
| Hardness (Durometer type A) | 21 |
| Elongation at break | 160% |
| Electrolytic corrosion resistance | see Table 1 |

Comparative Example 4

A composition was prepared as in Example 4 except that 2 parts of 1,1,3,3-tetramethyl-2-[3-(trimethoxysilyl)propyl]guanidine was used instead of 2 parts of the siloxane obtained in Reference Example. Physical properties of the composition were similarly determined, with the results shown below.

| | |
|---|---|
| Tack-free time | 6 min |
| Hardness (Durometer type A) | 55 |
| Elongation at break | 180% |
| Electrolytic corrosion resistance | see Table 1 |

TABLE 1

| | Example | | | | Comparative Example | | | |
|---|---|---|---|---|---|---|---|---|
| | 1 | 2 | 3 | 4 | 1 | 2 | 3 | 4 |
| Initial | ≧1000 MΩ | ≧1000 MΩ | ≧1000 MΩ | ≧1000 MΩ | ≧1000 MΩ | ≧1000 MΩ | ≧1000 MΩ | ≧1000 MΩ |
| 1 hr | ≧1000 MΩ | ≧1000 MΩ | ≧1000 MΩ | ≧1000 MΩ | 20 MΩ | 20 MΩ | 20 MΩ | 20 MΩ |
| 1 day | ≧1000 MΩ | ≧1000 MΩ | ≧1000 MΩ | ≧1000 MΩ | 30 MΩ | 30 MΩ | 20 MΩ | 50 MΩ |
| 2 days | ≧1000 MΩ | ≧1000 MΩ | ≧1000 MΩ | ≧1000 MΩ | 50 MΩ | 40 MΩ | 30 MΩ | 100 MΩ |
| 7 days | ≧1000 MΩ | ≧1000 MΩ | ≧1000 MΩ | ≧1000 MΩ | 70 MΩ | 80 MΩ | 50 MΩ | 200 MΩ |

Insulation resistance when aged at 80° C. RH 90%

It is evident that the one-part room temperature curable organopolysiloxane compositions of the invention cure into products which are resistant to electrolytic corrosion in that no decline of insulation resistance occurs upon application of voltage in a hot humid environment.

Japanese Patent Application No. 2001-196122 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A room temperature curable organopolysiloxane composition comprising (a) 100 parts by weight of an organopolysiloxane having the following general formula (I):

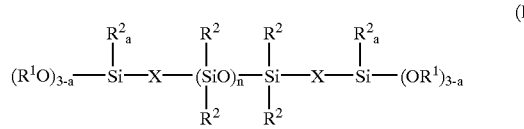

wherein $R^1$ is hydrogen, a substituted, or unsubstituted alkyl radical or a substituted or unsubstituted alkenyl radical, $R^2$ is independently a substituted or unsubstituted monovalent hydrocarbon radical, X is an oxygen atom or a divalent hydrocarbon radical, a is 0, 1 or 2, and n is an integer of at least 10, (b) 1 to 30 parts by weight of a substituted or unsubstituted alkenoxysilane having the following general formula (II):

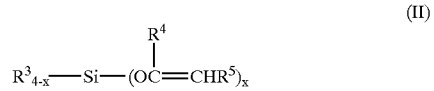

wherein $R^3$ is a substituted or unsubstituted monovalent hydrocarbon radical, $R^4$ and $R^5$ are each independently hydrogen or a substituted or unsubstituted monovalent hydrocarbon radical, and x is 3 or 4, or a partial hydrolyzate thereof, and (c) 0.01 to 10 parts by weight of a siloxane having the following general formula (IV):

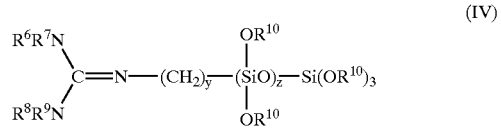

wherein $R^6$, $R^7$, $R^8$ and $R^9$ each are hydrogen or a monovalent hydrocarbon radical, and y is an integer of 1 to 6, $R^{10}$ is independently hydrogen, a monovalent hydrocarbon radical or a radical of the formula:

wherein $R^{11}$ is a substituted or unsubstituted monovalent hydrocarbon radical, $R^{12}$ is a monovalent hydrocarbon radical, and b is 0, 1 or 2, and z is an integer of 1 to 5, or a partial hydrolyzate thereof.

2. The organopolysiloxane composition of claim 1, wherein the organopolysiloxane (a) is capped with a hydroxyl radical at each end of its molecular chain.

3. The organopolysiloxane composition of claim 1, wherein organosiloxane component (a) has a viscosity of about 500 to 500,000 centistokes at 25° C.

4. The organopolysiloxane composition of claim 1, wherein alkenoxy silane component (b) is selected from the group consisting of methyltrivinyloxysilane, methyl-tri (isopropenyl-oxy)silane, vinyltri(isopropenyloxy)silane, phenyltri(iso-propenyloxy)silane, propyltri (isopropenyloxy)-silane, tetra(iso-propenyloxy)silane, methyltri(1-phenyl-ethenyloxy)silane, methyl-tri(1-butenyloxy)silane, methyl-tri(1-methyl-1-propenyloxy) silane, methyltri(1, 4-dimethyl-1, 3-pentadienyloxy)silane, and partial hydrolyzates thereof.

5. The organopolysiloxane composition of claim 1, wherein $R^6$, $R^7$, $R^8$, $R^9$, and $R^{10}$ are all methyl, y is 3, and z is an integer of 1 to 5.

6. The organopolysiloxane composition of claim 5, wherein component (b) is phenyltri (isopropenyloxy) silane and component (a) is a dimethylpolysiloxane capped with hydroxyl radicals at both end of its molecular chain and having a viscosity of 700 cSt at 25° C.

7. The organopolysiloxane composition of claim 5, wherein component (b) is vinyltri (isopropenyloxy) silane and component (a) is a dimethylpolysiloxane capped with trimethoxysilyl radicals at both ends of its molecular chain and having a viscosity of 20,000 cSt at 250° C.

8. The organopolysiloxane composition of claim 5, wherein component (b) is vinyltri (isopropenyloxy) silane and component (a) is a dimethylpolysiloxane capped, with diisopropenoxyvinylsilyl radicals at both ends of its molecular chain and having a viscosity of 20,000 cSt at 25° C.

9. The organopolysiloxane composition of claim 5, wherein component (b) is phenyltri (isopropenyloxy) silane and component (a) is a dimethylpolysiloxane capped with hydroxyl radicals at both ends of its molecular chain and having a viscosity of 5000 cSt at 25° C.

* * * * *